United States Patent
Ishibashi et al.

(10) Patent No.: US 6,958,529 B2
(45) Date of Patent: Oct. 25, 2005

(54) ACCELERATION SENSOR AND METHOD OF MANUFACTURE THEREOF

(75) Inventors: Kiyoshi Ishibashi, Tokyo (JP); Makio Horikawa, Tokyo (JP); Mika Okumura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 229 days.

(21) Appl. No.: 10/362,132

(22) PCT Filed: Jun. 21, 2001

(86) PCT No.: PCT/JP01/05343

§ 371 (c)(1),
(2), (4) Date: Feb. 21, 2003

(87) PCT Pub. No.: WO03/001217

PCT Pub. Date: Jan. 3, 2003

(65) Prior Publication Data

US 2003/0155622 A1     Aug. 21, 2003

(51) Int. Cl.[7] ............................................. H01L 21/00
(52) U.S. Cl. .................. 257/678; 257/704; 257/710; 438/51; 438/106
(58) Field of Search ............................. 257/252–254, 257/678–713; 438/48–55, 106–127

(56) References Cited

U.S. PATENT DOCUMENTS

| 5,343,602 A | | 9/1994 | Plankenhorn |
| 5,668,033 A | * | 9/1997 | Ohara et al. ................ 438/113 |
| 6,441,450 B1 | * | 8/2002 | Yamaguchi et al. ........ 257/417 |
| 6,694,814 B2 | | 2/2004 | Ishio |
| 2001/0040262 A1 | * | 11/2001 | Uchida et al. .............. 257/415 |

FOREIGN PATENT DOCUMENTS

| DE | 42 01 104 | 5/1993 |
| DE | 102 00 873 | 8/2002 |
| JP | 7-92186 | 4/1995 |
| JP | 7-273351 | 10/1995 |
| JP | 8-306936 | 11/1996 |
| JP | 10-79520 | 3/1998 |
| JP | 11-220141 | 8/1999 |
| JP | 2000-164890 | 6/2000 |
| JP | 2000-286430 | 10/2000 |
| JP | 2001-119040 | 4/2001 |
| WO | WO 99/31515 | 6/1999 |

* cited by examiner

*Primary Examiner*—H. Jey Tsai
(74) *Attorney, Agent, or Firm*—Oblon, Spivak, McClelland, Maier & Neustadt, P.C.

(57) ABSTRACT

An acceleration sensor which is inexpensive and accomplishes its small-size and light-weight structure, and a manufacturing method thereof. A sensor unit provided on a base is sealed by a cap joined to a frame portion of the base in an eutectic manner. The cap includes a cap main body made of a semiconductor material having a conductive property and a metal film provided on the circumferential edge of the cap main body. The frame portion includes a frame main body made of doped polysilicon, a diffusion preventive film selectively provided on the frame main body, and a joining layer. The joining layer has one area as a conductive portion made of a conductive material, and another area as a joining portion made of a semiconductor.

8 Claims, 11 Drawing Sheets

ACCELERATION SENSOR AND METHOD OF MANUFACTURE THEREOF

TECHNICAL FIELD

The present invention relates to an acceleration sensor formed by using a semiconductor processing technique, and a manufacturing method thereof.

BACKGROUND ART

As shown in FIG. 18, in a conventional acceleration sensor, a sensor main body 101 is sealed by a ceramic package 103 and a lid 105. In such a conventional acceleration sensor, there has a problem that the application of an expensive ceramic package results in high costs. In addition, there has a problem that the application of a ceramic package also causes the sensor to become bulky and heavier.

Moreover, as shown in FIG. 19, a wiring pattern 109 is provided on a substrate 107 of the sensor main body 101. The wiring pattern 109 is selectively formed on a flat surface of an oxide film 113 provided on the substrate main body 111. A nitride film 115 is formed in a manner so as to cover the surface of the oxide film 113 and the wiring pattern 109. Since the film thickness of this nitride film 115 is set to almost constant value, the surface of the substrate 107 is in an irregular state due to the presence of the wiring pattern 109.

DISCLOSURE OF THE INVENTION

The present invention has been devised to solve the above-mentioned problems, and an object thereof is to provide an acceleration sensor which is inexpensive and accomplishes a small-size and light-weight structure, and a manufacturing method thereof.

In a first aspect of the present invention, an acceleration sensor includes a base (11), and a cap (13) attached to the base, wherein the cap has a cap main body (13a) formed by a conductive semiconductor material, and a metal film (13b) formed on a circumferential edge thereof by using a metal material which can undergo an eutectic bonding with a semiconductor for joining, and the base has a substrate (15), a sensor unit (17) formed on the surface of the substrate, and having a function of detecting acceleration, and a frame portion (19) formed on the surface of the substrate in a manner so as to externally surround the sensor unit, at least one portion of a contact face making contacting with the circumferential edge of the cap being formed by the semiconductor for joining, with the at least one portion of the contact face being joined to the circumferential edge of the cap in an eutectic manner so that it cooperatively functions with the cap to seal the sensor unit from an external environment.

In accordance with this aspect, since the sensor unit is sealed by fixedly securing the cap to the base, the sensor unit can be protected from resin even when the sensor main body, which has a combined structure between the cap and base, is sealed by using an inexpensive resin sealing process in the same manner as a general IC chip; therefore, it becomes possible to make the acceleration sensor inexpensive, and accomplishes a small-size and light-weight structure.

Moreover, since the securing process of the cap to the base is carried out through an eutectic bonding, the securing process can be carried out without using a bonding material such as low-melting-point glass. For this reason, it is possible to eliminate the necessity of a coating process of the bonding material to the base, and also to eliminate the necessity of taking deviations of the coating position of the bonding material into consideration; consequently, it becomes possible to make the sensor size smaller.

Furthermore, since the cap main body of the cap has a conductive property, the cap can be electrically connected to the base so that it becomes possible to prevent structures inside the sensor unit of the base from sticking to the cap due to influences of static electricity that has been accumulated in the cap.

Since the acceleration sensor is formed by a semiconductor processing technique, it is possible to easily assemble a circuit used for signal processing and the like in the base.

In a second aspect of the acceleration sensor in accordance with the present invention, the substrate includes a substrate main body (31), an insulating film (33) formed on the substrate main body, a wiring pattern (35) selectively formed on the insulating film and drawn from the inside to the outside of an area surrounded by the frame portion, grooves (33a), which correspond to the wiring pattern, are formed in the insulating film, and the wiring pattern is embedded into the grooves of the insulating film at least under the frame portion, the film thickness thereof is made coincident with a depth of the grooves.

In accordance with this aspect, the wiring pattern, formed in the substrate of the base, is embedded in the grooves formed on the surface of the insulating film of the substrate so that the film thickness of the wiring pattern is made coincident with the depth of the grooves; thus, it is possible to eliminate the irregularity of the substrate surface due to the presence of the wiring pattern, and consequently to flatten the substrate surface. As a result, without the necessity of carrying out complicated processes in the formation process of the frame portion, such as a partially adjusting process of the film thickness of the frame portion, it is possible to easily flatten the contact surface to the cap of the frame portion.

In a third aspect of the acceleration sensor in accordance with the present invention, the frame portion includes a conductive frame main body (19a) on the surface of the substrate, and a joining layer (19c) formed on the frame main body, and joined to the metal layer of the cap in an eutectic manner, and the joining layer includes a conductor portion formed by a conductive material and located in an area of one portion of the upper face of the frame main body, and a joining portion formed by the semiconductor for joining and located in an area other than the area on the upper face of the frame main body having the conductor portion.

In this aspect, since it is possible to electrically connect the cap to the base through the conductor and the frame main body, it is not necessary to provide a special means used for connecting the cap.

Moreover, it is possible to electrically connect the cap to the base through the eutectic bonding between the cap and base.

Moreover, the joining layer of the portion, which is joined to the cap in the eutectic manner, has its one portion set to a conductive conductor portion with the other area being set to a joining portion formed by the semiconductor for joining; therefore, the joining layer may be used for eutectic bonding and electrical connection between the cap and the frame portion.

In accordance with a fourth aspect of the acceleration sensor in accordance with the present invention, the wiring pattern and the frame main body of the frame portion are electrically connected to each other.

In this aspect, in accordance with the eutectic bonding of the cap to the base, the wiring pattern placed on the base substrate and the cap are electrically connected to each other through the frame portion so that it is possible to easily set the cap and the wiring pattern to the same electrical potential.

In a fifth aspect of the acceleration sensor of the present invention, the sensor unit includes a conductive mass body (21) for detecting acceleration, which is supported with a predetermined gap from the substrate, and a supporting portion (25a) integrally formed with the mass body on the substrate by using a material having a conductive property, and supporting the mass body, and the wiring pattern is placed under the supporting portion so as to be electrically connected to the supporting portion, and arrange in a manner so as to be exposed on the substrate at an opposing area which faces the mass body on the substrate.

In accordance with this aspect, the formation of the mass body and the supporting portion of the sensor unit on the substrate makes it possible to electrically connect the wiring pattern formed on the substrate to the mass body through the supporting portion so that it is possible to easily set the mass body and the wiring pattern to the same electrical potential, and also to prevent the mass body from sticking to the substate due to static electricity from the point of time at which the mass body was formed.

Moreover, since the wiring pattern is placed in a manner so as to be exposed on the substrate at the opposing area facing the mass body on substrate, it is possible to set the mass body and the wiring pattern to the same electrical potential, and consequently to prevent the mass body and the substrate from sticking to each other by static electricity.

In a sixth aspect of the acceleration sensor in accordance with the present invention, the wiring pattern if formed by a semiconductor in which impurities are doped.

In a seventh aspect of the acceleration sensor in accordance with the present invention, the wiring pattern is formed by metal having a high-melting point.

In a first aspect of manufacturing method of an acceleration sensor in accordance with the present invention, a manufacturing method of an acceleration sensor according to claim 1, includes the steps of: forming the plurality of bases (11) on a first wafer (51) in a matrix format; forming the plurality of caps (13) on a second wafer (53) in a matrix format at positions corresponding to the formation positions of the respective bases formed on the first wafer; joining said respective bases to the respective caps in an eutectic manner by superposing the first wafer on the second wafer and applying a heated process thereto with the frame portion (19) of each of the bases and the circumferential edge of each of the caps being positioned so as to make contact with each other, dicing the first wafer and second wafer so that the sensor main bodies (1), each being formed by joining the respective bases and the respective caps, are separated from one another.

In accordance with this aspect, the first wafer on which a plurality of bases are formed and the second wafer on which a plurality of caps are formed are positioned and superposed so that, after simultaneously joining the respective caps and the respective bases in an eutectic manner, the first wafer and the second wafer are subjected to dicing process; therefore, it is not necessary to individually handle the bases and the caps that are small parts so that it is possible to manufacture a plurality of acceleration sensors efficiently.

In a second aspect of a manufacturing method of an acceleration sensor in accordance with the present invention, the manufacturing method of an acceleration sensor, further includes the steps of: die-bonding the sensor main body to a lead frame (67); electrically connecting the pad portion (3) of the sensor main body and the lead frame to each other through wire bonding; sealing the sensor main body by a sealing member (7) made of resin; and forming a lead (5) by forming the lead frame.

In a third aspect of a manufacturing method of an acceleration sensor in accordance with the present invention, the manufacturing method of an acceleration sensor according to claim 2, includes the steps of: forming the insulating film (33) on the substrate main body (31); forming the grooves (33a) by partially etching the surface of the insulating film; depositing a conductive film (55) on the insulating film by using the same material as the wiring pattern (35) with a film thickness which is the same as the depth of the grooves; patterning the conductive film so as to remove portions other than a portion (55a) located inside each of the grooves by a predetermined gap dimension (F) from the side edge of each of the grooves in the conductive film so that residual portions form the wiring pattern; and forming the sensor unit (17) and the frame portion (19) on the substrate (15).

In accordance with this aspect, on the conductive film deposited on the insulating film, a portion located inside the grooves with a predetermined gap dimension from the side edge of each of the grooves in the conductive film is left with the other portions being removed therefrom, and the wiring pattern is formed by the residual portion of the conductive film; therefore, it is possible to form the wiring pattern with a uniform film thickness, and consequently to flatten the substrate surface more effectively.

These and other objects, features, aspects and advantages of the present invention will become more apparent in conjunction with the following detailed description and the accompanying drawings.

BRIEF DESCRIPTION OF THE DRAWINGS

FIGS. 12 and 13 are views showing forming processes of a mass body and the like;

BEST MODES FOR CARRYING OUT THE INVENTION

Figure 1:
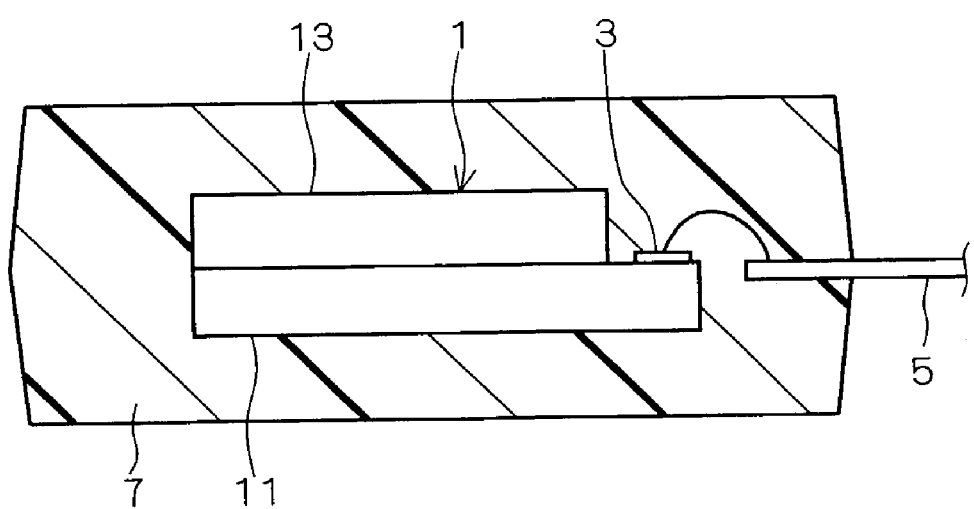
FIG. 1 is a cross-sectional view of a semiconductor acceleration sensor in accordance with one embodiment of the present invention.
Figure 2:
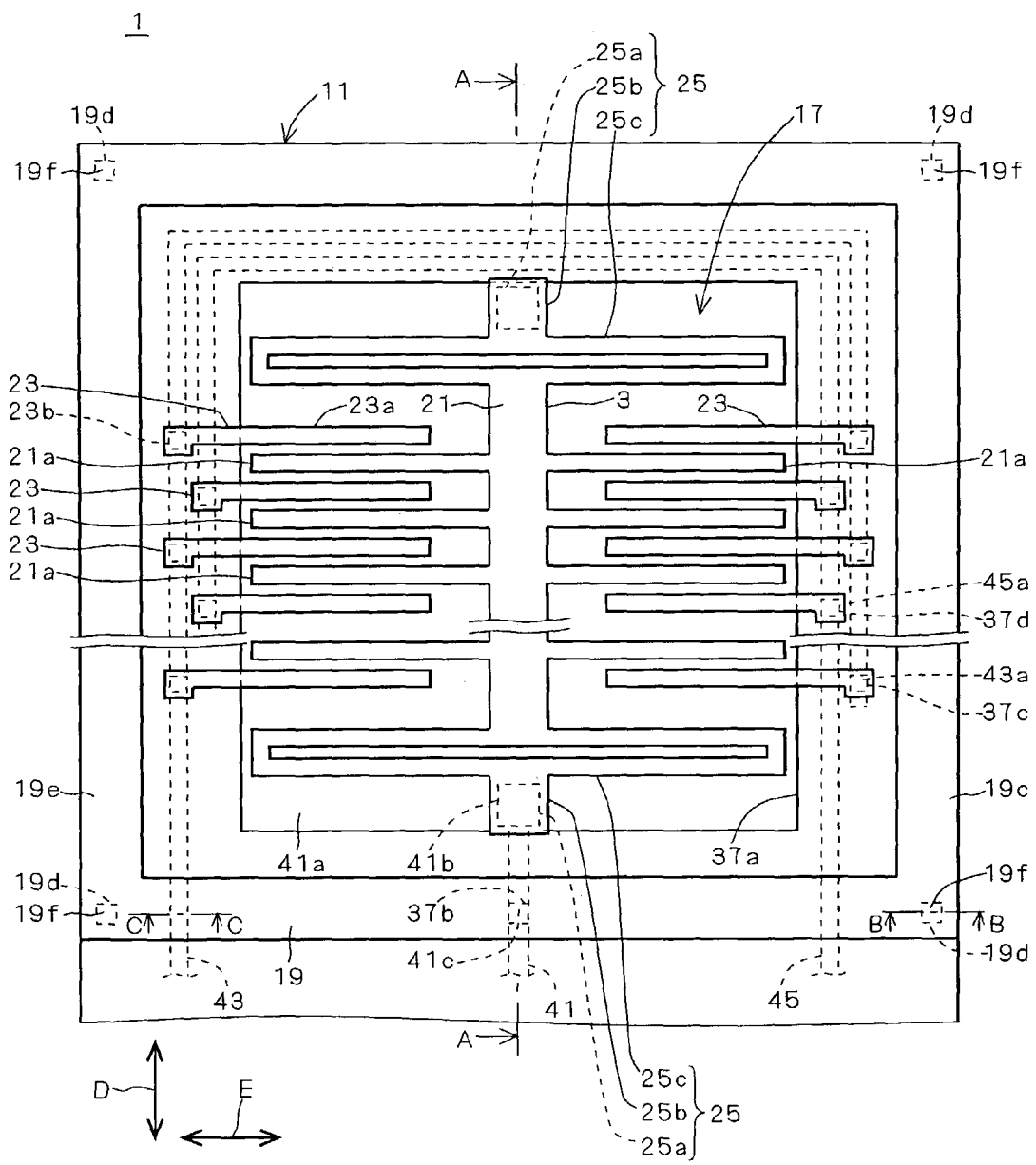
FIG. 2 is a plan view showing a configuration of a main part of a sensor main body in a state where caps are removed.

As shown in FIG. 1, a semiconductor acceleration sensor in accordance with one embodiment of the present invention includes a sensor main body 1, a lead 5 electrically connected to a pad portion 3 of the sensor main body 1, and a sealing member 7, made of resin, enclosing and sealing the sensor main body 1. The sensor main body 1 includes a base 11 and a cap 13. In FIG. 2, the cap 13 is removed for convenience of description.

Figure 3:
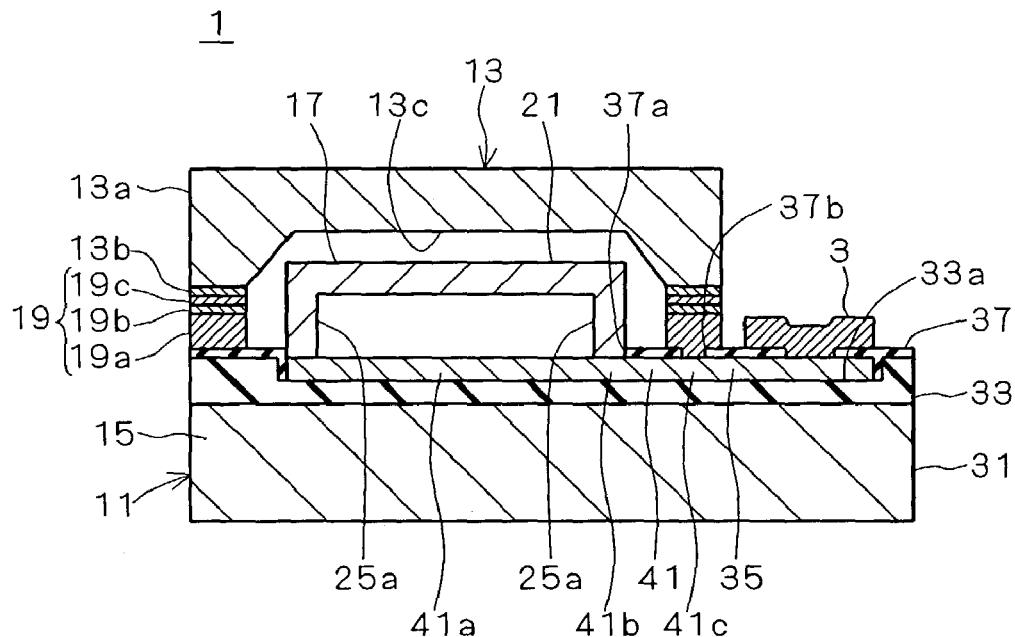
FIG. 3 is a cross-sectional view taken along line A—A of the sensor main body of FIG. 2.

As shown in FIG. 3, the cap 13 includes a cap main body 13a and a metal film 13b. The cap main body 13a is formed by a semiconductor material having a conductive property, such as silicon in which predetermined impurities are doped. As shown in FIG. 3, a recessed section 13c for housing a sensor unit 17 of the base 11, which will be described later, is formed on an opposing face of the cap main body 13a, the opposing face faces the base 11. The metal film 13b placed for allowing eutectic bonding between the cap 13 and the base 11 is provided on a face on the opening side of the recessed section 13c of an outer circumferential face of the cap main body 13a (hereinafter, referred to as "circumferential edge") in a manner so as to surround the recessed section 13c. With respect to the material of the metal film 13b, a metal material which allows eutectic bonding to a semiconductor for joining, which will be described later, is selected. In the present embodiment, since polysilicon without doped impurities is used as the semiconductor for joining, the metal film 13b is preferably formed by nickel, for example. In this case, with respect to a more specific configuration example, the metal film 13b is preferably formed by vapor-depositing a titanium layer on the cap main body 13a, and then vapor-depositing a nickel layer thereon.

The base 11 includes a substrate 15, a sensor unit 17, a frame portion 19 and a plurality of pad portions 3.

Figure 5:
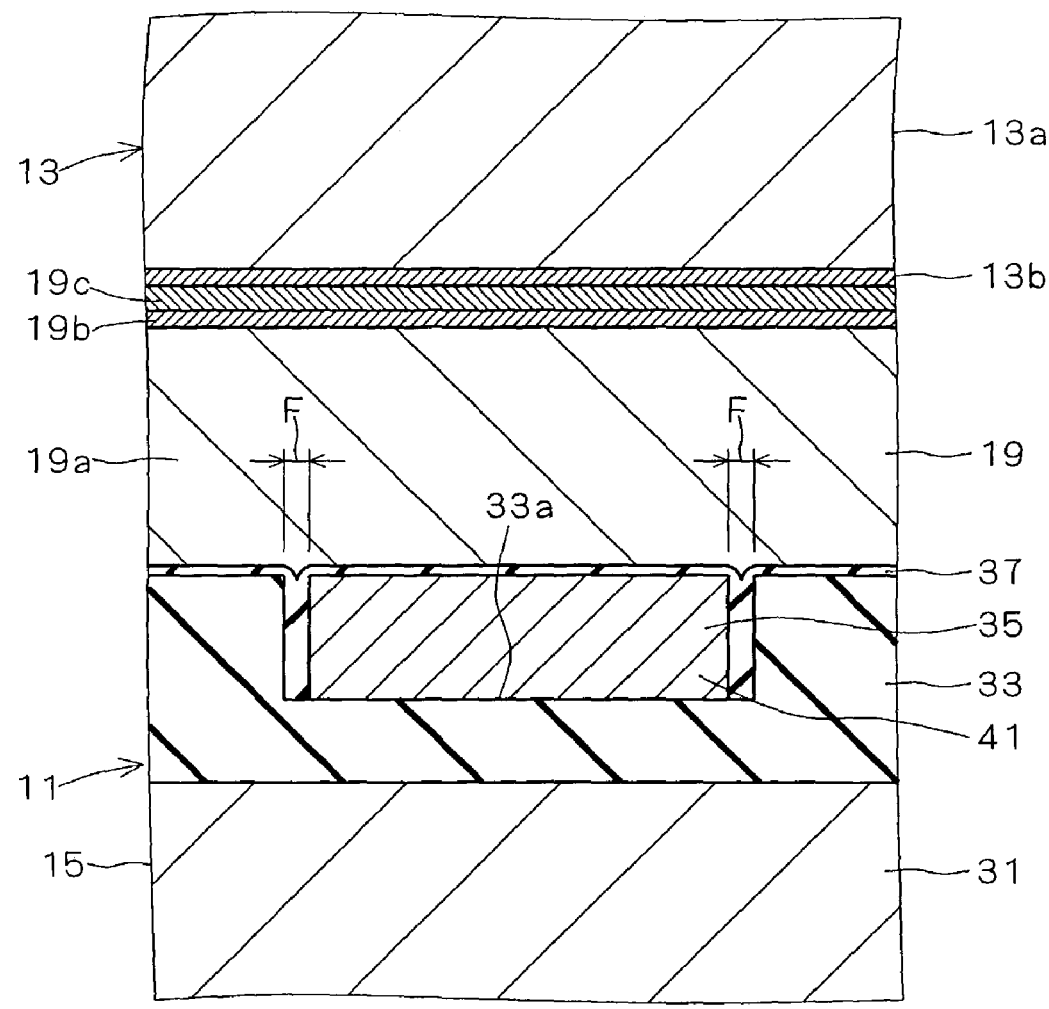
FIG. 5 is a cross-sectional view that is taken along line C—C of the sensor main body of FIG. 2.

As shown in FIGS. 3 and 5, the substrate 15 includes a substrate main body 31 formed by a semiconductor such as silicon, an oxide film 33 serving as an insulating film formed on the substrate main body 31, a wiring pattern 35 selectively formed on the oxide film 33, and a nitride film 37 selectively covering the surface of the wiring pattern 35 and the surface of the oxide film 33, and functioning as an insulating film.

The frame portion 19 is formed on the surface of the substrate 15, more specifically, on the surface of the nitride film 37 and the surface of the wiring pattern 35 exposed through the nitride film 37, in a manner so as to surround the sensor unit 17. The frame portion 19 is joined to the circumferential edge of the cap 13 in an eutectic manner so that it seals the sensor unit 17 from the external environment in cooperation with the cap 13. The pad portion 3 is formed on the outside of the frame portion 19 on the substrate 15.

Figure 4:
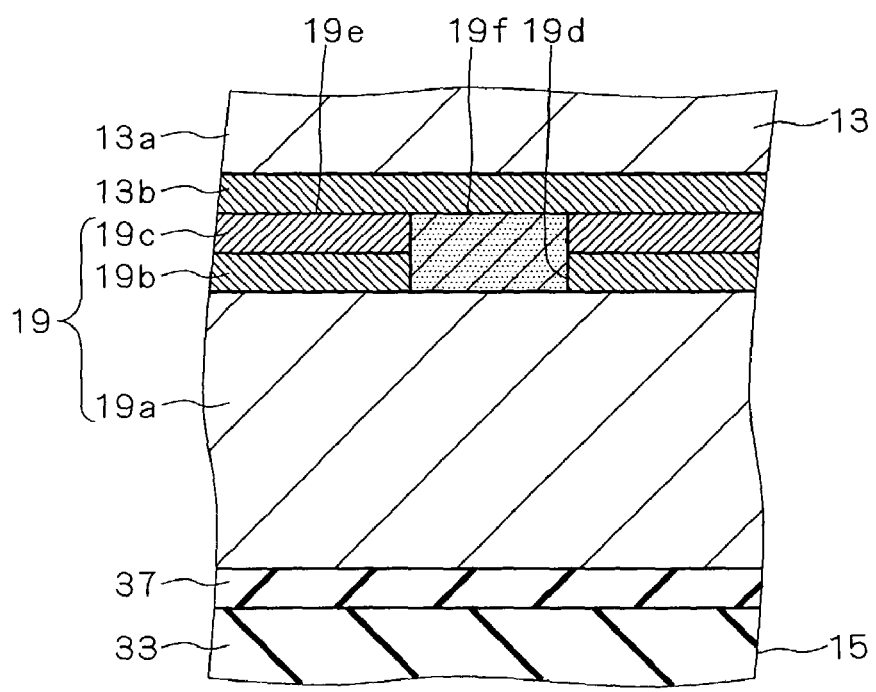
FIG. 4 is a cross-sectional view taken along line B—B of the sensor main body of FIG. 2.

As shown in FIGS. 3 and 4, the frame portion 19 includes a frame main body 19a formed on the surface of the substrate 15, a diffusion preventive film 19b formed on the frame main body 19a, and a joining layer 19c formed on the diffusion preventive film 19b. The frame main body 19a is formed by a conductive material, such as a semiconductor material having a conductive property with impurities such as phosphorus being doped therein, for example, doped polysilicon.

The diffusion preventive film 19b is formed in a manner so as to cover the upper face of the frame main body 19a except for one portion thereof, so as to prevent the impurities in the frame main body 19a from diffusing toward the joining layer 19c at the time of applying heat for an eutectic bonding. In the present embodiment, at least one hole 19d is provided in the diffusion preventive film 19b, so that the impurities inside the frame main body 19a are allowed to diffuse toward the joining layer 19c side through the hole 19d. The diffusion preventive film 19b is formed by, for example, a TEOS (tetraethylorthosilicate) oxide film. Moreover, in the present embodiment, the hole 19d is formed in each of the four corners of the frame portion 19.

The joining layer 19c includes a joining portion 19e and a conductive portion 19f, and formed so as to cover the surface of the diffusion preventive film 19b and the upper face of the frame main body 19a exposed through the holes 19d. A portion of the joining layer 19c, which is located on the diffusion preventive film 19b, forms the joining portion 19e, and a portion thereof, which is located on the upper face of the frame main body 19a exposed through the holes 19d, forms the conductive portion 19f.

The joining portion 19e is formed by polysilicon corresponding to the above-mentioned semiconductor for joining. No impurities are doped in this polysilicon. The conductive portion 19f is formed by a conductive material, for example, a conductive semiconductor. With respect to the conductive semiconductor, for example, polysilicon which is the same semiconductor as the semiconductor forming the joining portion 19e with impurities, for example, phosphorus being doped therein, is adopted.

The sensor unit 17 is formed on the surface of the substrate 15, and allowed to have a function of detecting acceleration. As shown in FIG. 2, the sensor unit 17 includes a mass body 21 functioning as a movable electrode, a plurality of fixed electrodes 23 and a plurality of beams 25. The mass body 21, the fixed electrodes 23 and the beams 25 are formed by the same conductive material as the frame main body 19a, such as doped polysilicon formed by doping impurities, for example, phosphorus, in polysilicon.

The mass body 21 has a plurality of movable electrode portions 21a extending in direction E which is perpendicular to direction D of the acceleration to be detected. The beams 25 are integrally formed with the mass body 21, and have a function of suspending the mass body 21 movably in direction D above the substrate 15 with a restoring force. Each beam 25 includes a supporting portion 25a protruding from the substrate 15, a connecting portion 25b to the supporting portion 25a, and a spring portion 25c provided between the connecting portion 25b and the edge of the mass body 21 with respect to direction D. This spring portion 25c is elastically bent and deformed so that it is allowed to expand and reduce the distance between connecting portion 25b and the mass body 21 along direction D.

The fixed electrodes 23 are provided along direction E with a predetermined gap from each other in direction D. Further, the fixed electrodes 23 include fixed electrode portions 23b placed with a predetermined gap from the substrate 15, and supporting portions 23b supporting the fixed electrode portions 23a.

These fixed electrode portions 23b of the fixed electrodes 23 and the movable electrode portions 21a of the mass body 21 are alternately arranged with gaps with respect to direction D so that a capacitor is formed. Thus, acceleration is detected based upon changes in the capacity of the capacitor caused by the shift of the movable electrode portions 21a.

Grooves 33a are formed at portions on the surface of the oxide film 33 on which the wiring pattern 35 is provided. The wiring pattern 35 is formed so as to be embedded into the grooves 33a, and set to have a film thickness that is made coincident with the depth of the groove 33a. This wiring pattern is formed by doped polysilicon which is a fourth semiconductor in which impurities, for example, phosphorus, are doped. Alternatively, the wiring pattern 35 may be formed by a high-melting point metal.

Such a wiring pattern 35 is adopted in, for example, wires 41, 43, 45 shown in FIG. 2. These wires 41, 43, 45 are drawn outside from the area surrounded by the frame portion 19, and electrically connected to the pad portions 3 that are different from each other.

The wire 41 includes an exposed portion 41a placed on the substrate 15 in an exposed state at an opposing area facing the mass body 21 of the substrate 15, a first contact portion 41b placed at a lower portion of the supporting portion 25a, and electrically connected to the supporting portion 25a, and a second contact portion 41c placed at a lower portion of the frame portion 19, and electrically connected to the frame portion 19. The wires 43, 45, which are used for obtaining signals from the fixed electrodes 23, are connected to the respective fixed electrodes 23 through the contact portions 43a, 45a.

In the corresponding manner, the nitride film 37 has a window section 37a and holes 37b, 37c and 37d. An exposed portion 41a of the wire 41 is exposed to the substrate 15 through the window portion 37a, and the contact portion 41a is electrically connected to the supporting portion 25a. A contact portion 41b of the wire 41 is electrically connected to the frame portion 19 through the hole 37b. The contact portions 43a, 45a of the wires 43, 45 are electrically connected to the fixed electrode 23 through the holes 37c, 37d.

Figure 6:
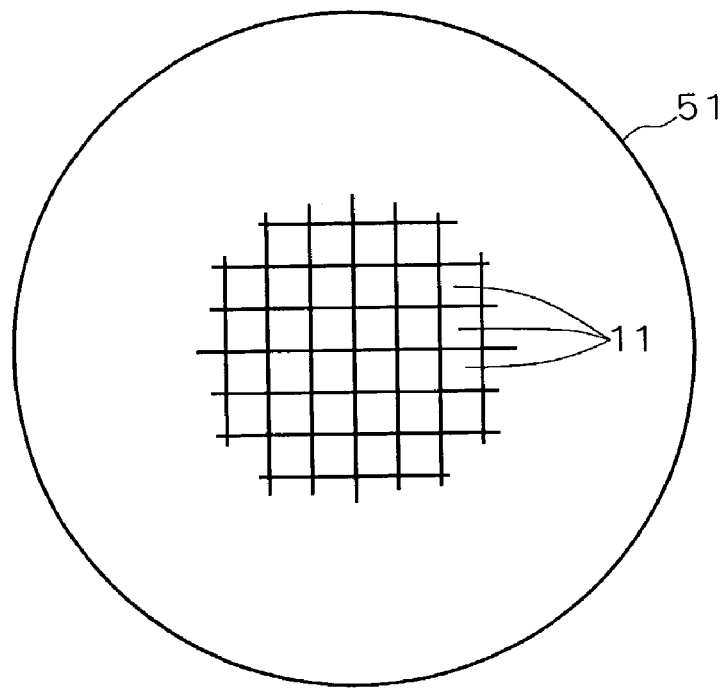
FIG. 6 is a plan view showing a wafer on which bases are formed.
Figure 7:
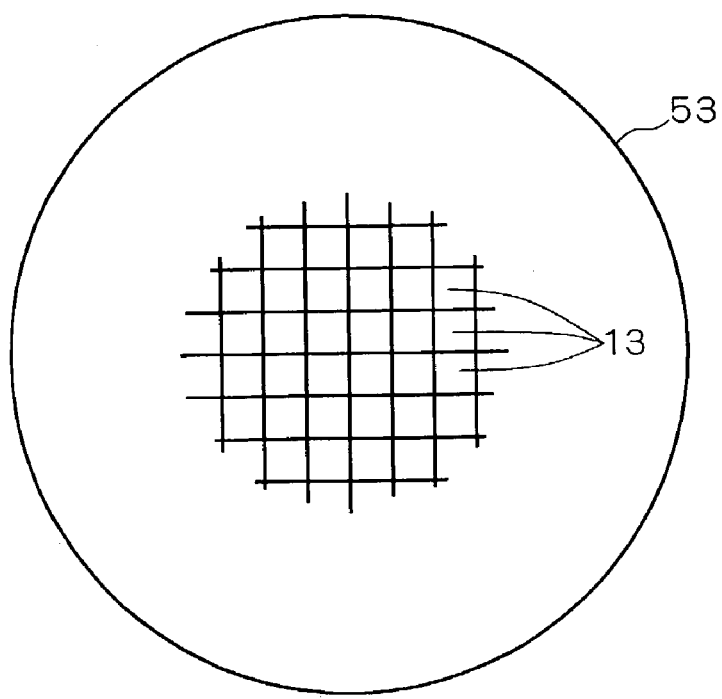
FIG. 7 is a plan view showing a wafer on which caps are formed.

Next, the following description will discuss manufacturing processes of this semiconductor acceleration sensor. As shown in FIGS. 6 and 7, a plurality of bases 11 and caps 13 are respectively formed on wafers 51, 53 serving as first and second wafers, in a matrix format. The formation positions of the respective bases 11 and caps 13 on the wafers 51, 53 are respectively associated with each other. The wafer 51 is formed by the same material as the material of the substrate main body 31 of the base 11, and the wafer 52 is formed by the same material as the material of the cap main body 13a of the cap 13.

The caps 13 are formed by forming a plurality of recessed sections 13c on the one side surface of the wafer 53 in a matrix format with a metal film 13b being selectively formed on predetermined positions on the surface on the other side. Moreover, the bases 11 are formed in the following manner.

Figure 8:
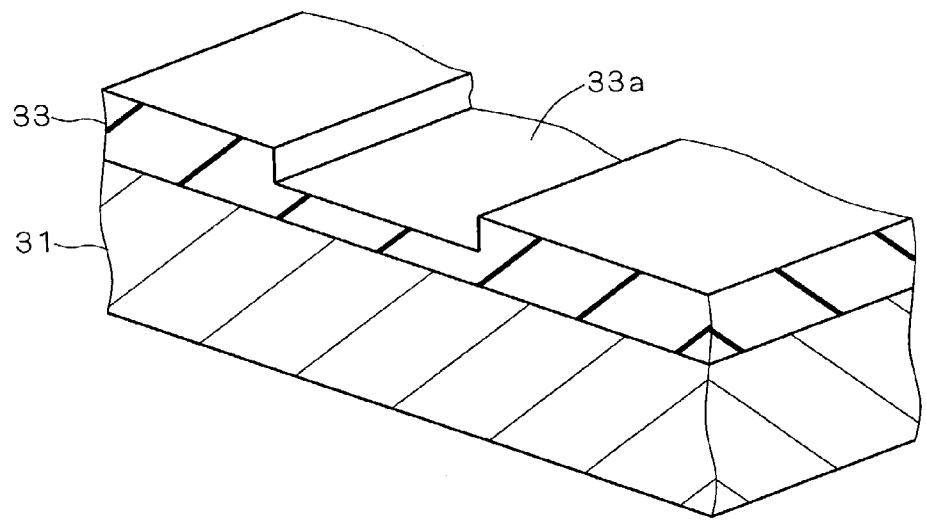
FIGS. 8 to 11 are views showing forming processes of a wiring pattern.

First, an oxide film 33 is formed on the substrate main body 31 made by the wafer 51, and grooves 33a are formed at positions on the surface of the oxide film 33 corresponding to the wiring pattern 35. Thus, a structure shown in FIG. 8 is obtained.

Figure 9:
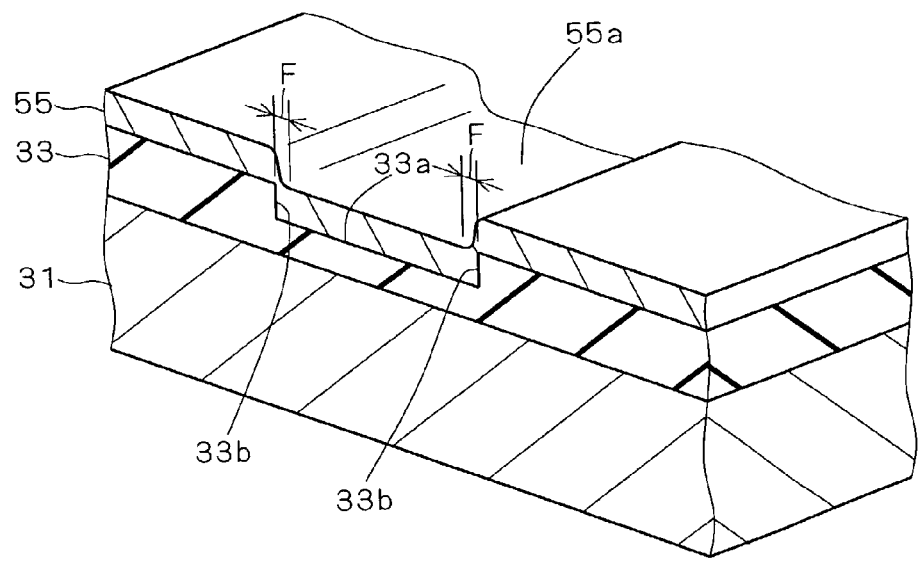

Next, as shown in FIG. 9, a conductive film 55 used for forming the wiring pattern 35 is deposited on the oxide film 33. The material of this conductive film 55 is the same as the material of the wiring pattern 35, and its film thickness is set to the same as the depth of the grooves 33a.

Figure 10:
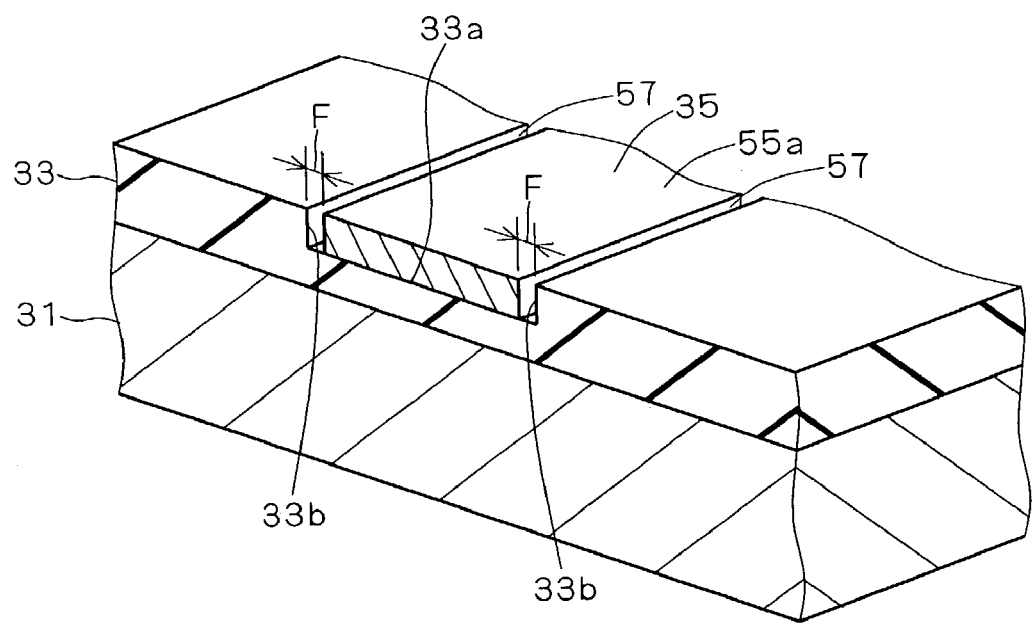

Next, the conductive film 55 is selectively removed and patterned by using a mask pattern, not shown. This patterning process makes it possible to remove a portion of the conductive film 55 except for a portion 55a that is located inside the groove 33a with a predetermined gap dimension F from each of the side edges 33b of the groove 33a. Thus, as shown in FIG. 10, the portion 55a is allowed to form the wiring pattern 35.

In this manner, the wiring pattern 35 is formed with a margin corresponding to the gap dimension F inside the groove 33a from each of the side edges 33b so that it is possible to form the wiring pattern 35 having a flat surface with a uniform film thickness. The gap dimension F is set to not more than 0.5 µm, for example, 0.3 µm. At this time, the gap 57 having the dimension F is placed between the circumferential edge of the wiring pattern 35 and each of the side edges 33b of the groove 33a.

Figure 11:
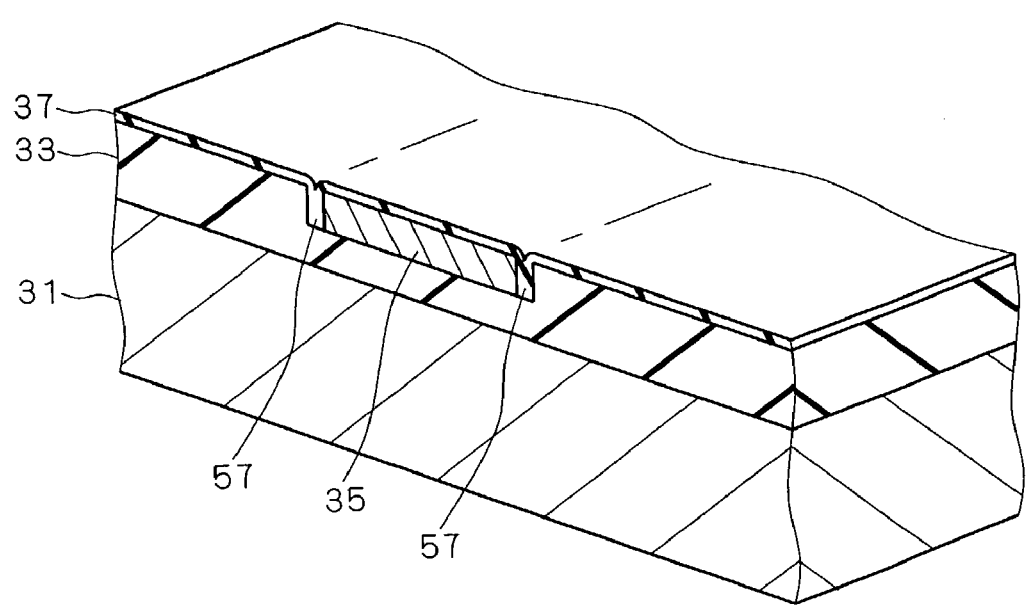

Next, as shown in FIG. 11, the nitride film 37 is formed over the entire area of the substrate 15 so as to cover the wiring pattern 35. At this time, the inside of the gap 57 is filled with the nitride film 37. Successively, the nitride film 37 is selectively removed by using a mask pattern, not shown, so that the window section 37a and the holes 37b, 37c, 37d are formed.

Successively, the sensor unit 17, the frame portion 19 and the pad portions 3 are formed. The frame main body 19a of the frame portion 19 is formed in association with the formations of the mass body 21 of the sensor unit 17, the beams 25 and the fixed electrodes 23. The formations of the mass body 21, the beams 25, the fixed electrodes 23 and the frame main body 19a are schematically carried out in the following manner.

Figure 12:
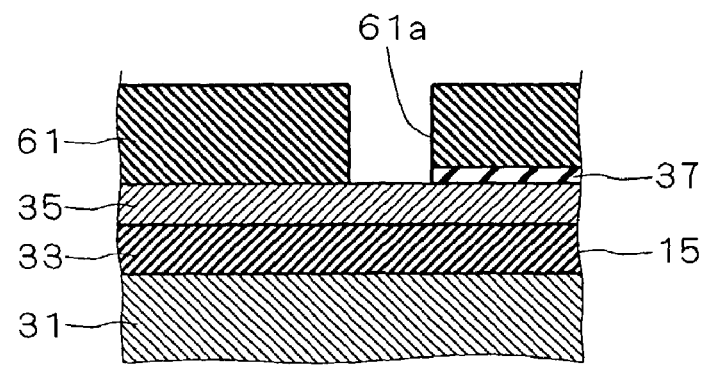

First, as shown in FIG. 12, a sacrifice film 61, for example, a sacrifice oxide film, is formed on the substrate 15. Next, the sacrifice film 61 is selectively removed and patterned. Thus, anchor holes 61a are formed at portions of the sacrifice film 61 on which the supporting portions 25a, 23b are to be formed, while a portion of the sacrifice film 61 in which the frame portion 19 is to be formed is removed. On the bottom face of the anchor hole 61a, the wiring pattern 35 is placed in an exposed state in accordance with the necessity of electric connection.

Figure 13:
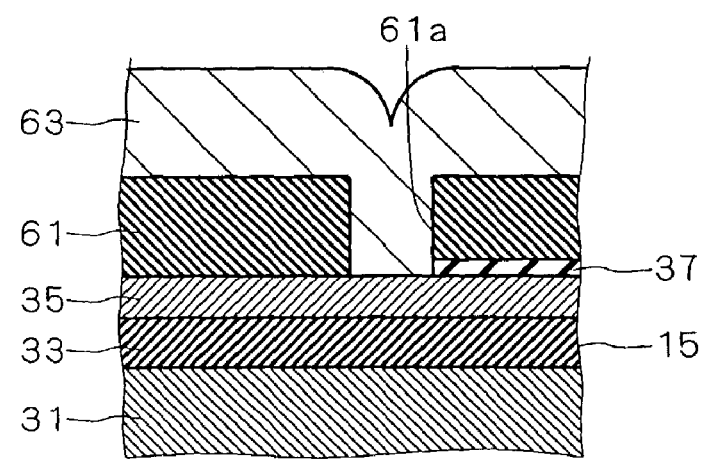

Next, as shown in FIG. 13, a conductive layer 63 is deposited on the sacrifice film 61 and the exposed portions of the substrate 15 by doped polysilicon that is a conductive material. Successively, the conductive layer 63 is selectively removed, and patterned so that the residual portions of the conductive layer 63 form the mass body 21, the beams 25, the fixed electrodes 23 and the frame main body 19a. In this case, portions of the conductive layer 63, fitted into the anchor holes 61a of the sacrifice film 61, form the supporting portions 25a, 23b. Then, the sacrifice film 61 is removed.

The formations of these mass body 21, beams 25 and fixed electrodes 23 make the supporting portions 25a, 23b electrically connected to the contact portions 41b, 43a and 45a of the wires 41, 43, 35 through the window section 37a and holes 37c, 37d of the nitride film 37. Moreover, the formation of the frame main body 19a makes the frame main body 19a electrically connected to the contact portion 41c of the wire 41 through the hole 37b of the nitride film 37 of the frame main body 19a.

Figure 14:
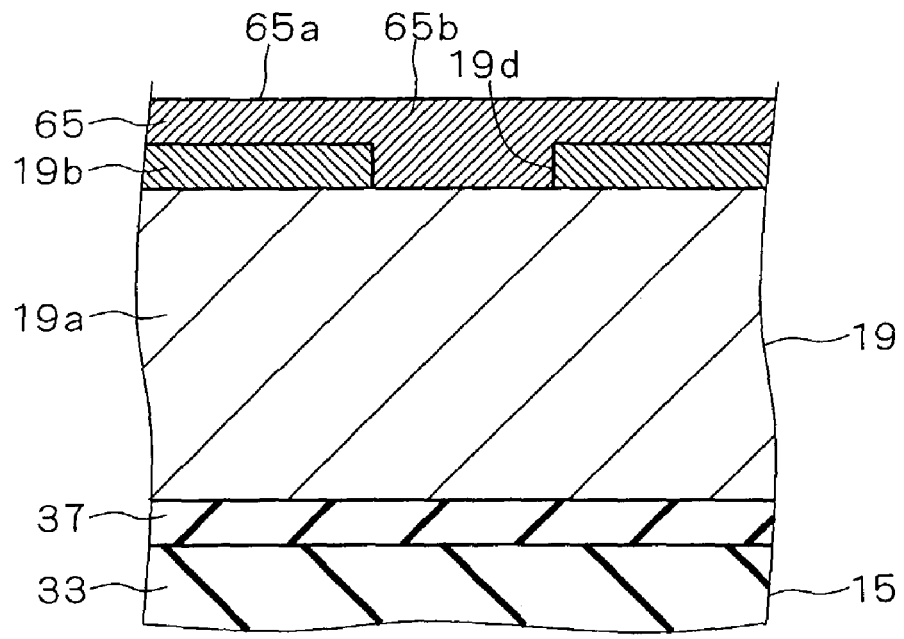
FIG. 14 is a view showing forming processes of a frame portion.

Successively, as shown in FIG. 14, a diffusion preventive film 19b is selectively formed on the frame main body 19a, and a semiconductor layer 65 is formed by polysilicon that is a semiconductor for joining on the surface of the diffusion preventive film 19b as well as on the upper face of the frame main body 19a that is exposed through the hole 19d of the diffusion preventive film 19b. This semiconductor layer 65 corresponds to the joining layer 19c so that a portion 65a of the semiconductor layer 65 positioned on the diffusion preventive film 19b, as it is, is allowed to form the joining portion 19e of the joining layer 19c. Moreover, a portion 65b of the semiconductor layer 65, positioned in the hole 19d and the upper portion of the hole 19d, is made conductive by a heating process at the time of an eutectic bonding process, as will be described later, to form a conductive portion 19f of the joining layer 19c.

Figure 15:
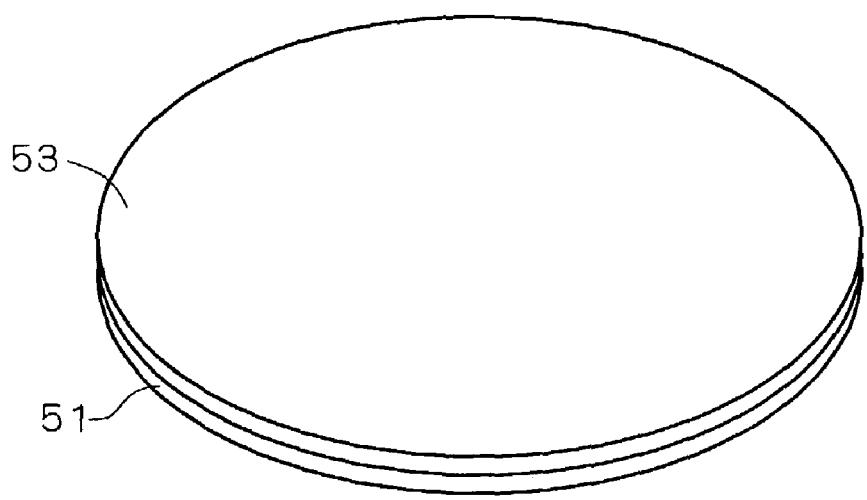
FIGS. 15 and 16 are view showing a state where the bases and the caps are joined to each other.
Figure 16:
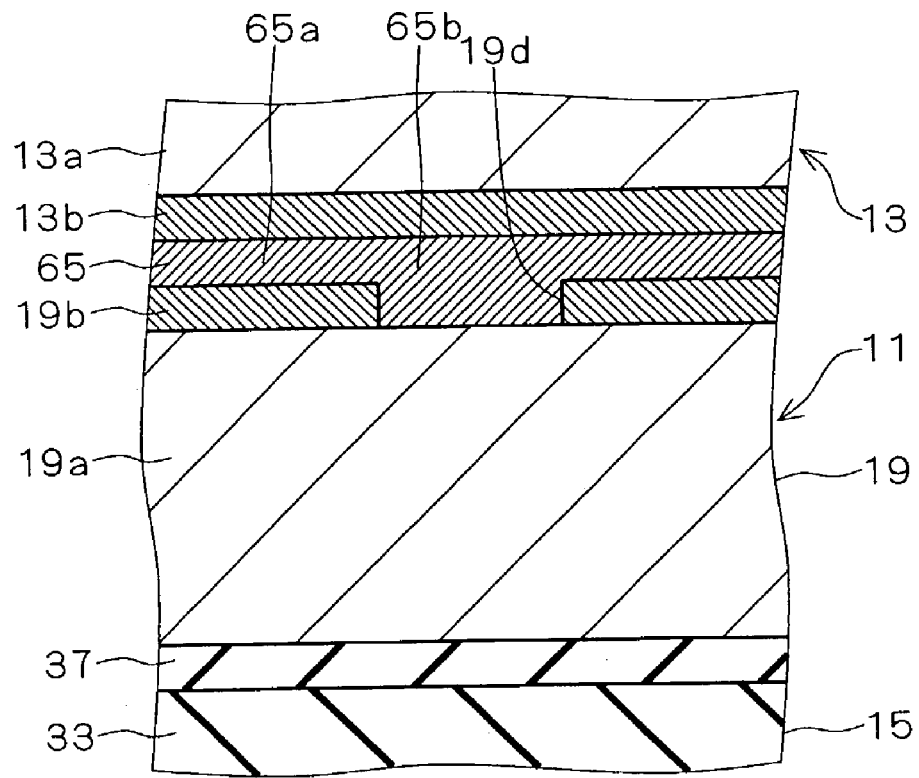

Successively, as shown in FIGS. 15 and 16, the wafers 51, 53 are positioned, and superposed on each other so that the frame portion 19 of each base 1 is made in contact with the circumferential edge of each cap 13 on which the metal film 13b is formed.

Next, the wafers 51, 53 are subjected to a heating process in their superposed state. This heating process causes an eutectic reaction at the contact portion between the joining layer 19c of the frame portion 19 of each base 11 and the metal film 13b of each cap 13; thus, the respective bases 11 and the caps 13 are joined to each other in an eutectic manner. Moreover, this heating process makes the impurities inside the frame main body 19a of the frame portion 19 thermally diffused toward the inside of the portion 65b of the semiconductor layer 65 through the hole 19d of the diffusion preventive film 19b so that the corresponding portion 65b is made conductive to form a conductor portion 19f. Moreover, this process allows the conductor portion 19f and the cap 13 to be electrically connected to each other, with the result that the cap 13 is allowed to electrically conduct to the wire 41 through the conductor portion 19f and the frame main body 19a.

Here, not only the joining portion 19e of the joining layer 19c, but also the conductor portion 19f, is joined to the metal film 13b of the cap 13 in an eutectic manner; and in this case, impurities, entered the inside of the conductor portion 19f from the frame main body 19a side, might intervene with the eutectic reaction. However, in the present embodiment, since the conductor portion 19f is formed only at a small area inside the joining layer 19c, it is possible to connect the cap 13 and the frame portion 19 through eutectic bonding with sufficient strength and reliability.

Figure 17:
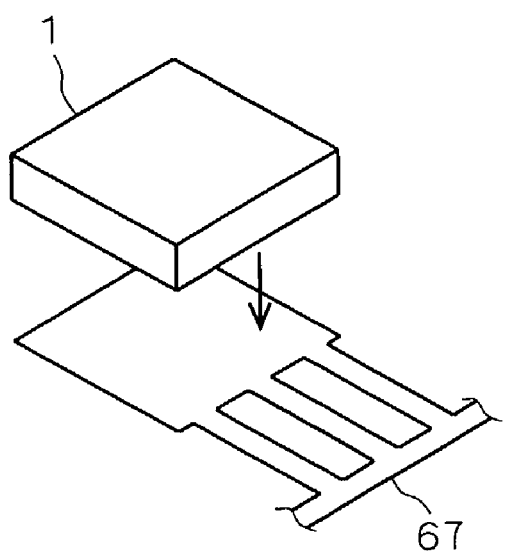
FIG. 17 is a view showing a state where a sensor main body is placed on a lead frame.
Figure 18:
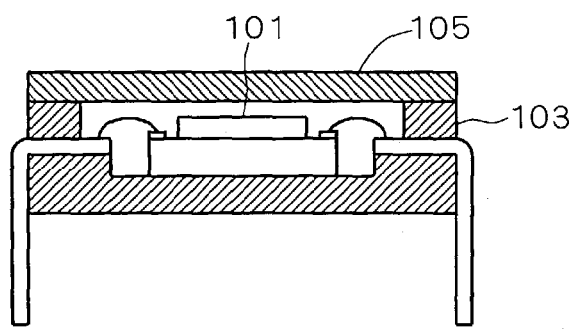
FIG. 18 is a cross-sectional view showing a conventional semiconductor acceleration sensor.
Figure 19:
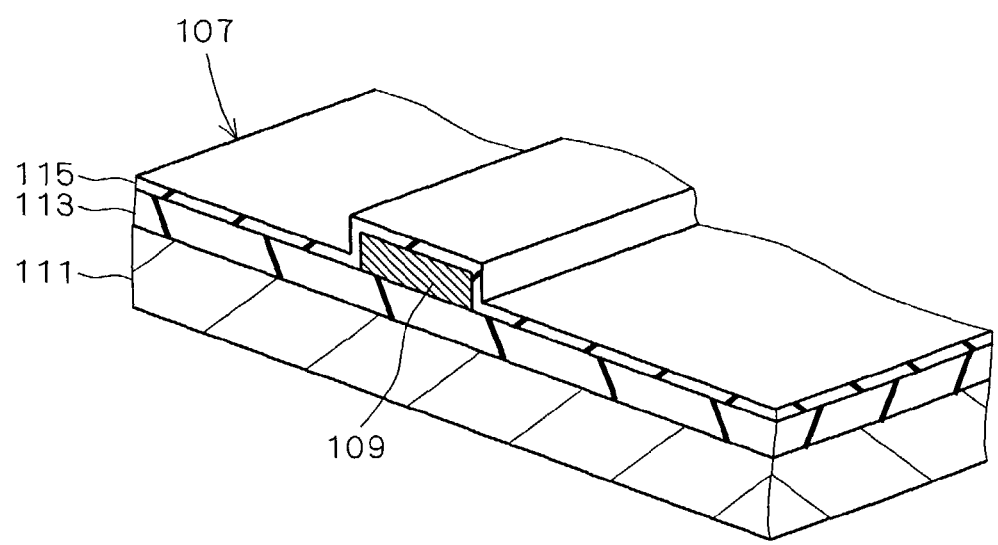
FIG. 19 is a view showing a wiring structure of the conventional semiconductor acceleration sensor.

Successively, the respective sensor main bodies 1 are separated from one another by subjecting the wafers 51, 53 joined to each other in this manner to a dicing process. Then, as shown in FIG. 17, the sensor main body 1 is die-bonded to the lead frame 67, and the pad portion 3 of the sensor main body 1 and the lead frame 67 are electrically connected to each other through wire bonding. Next, as shown in FIG. 1, the sensor main body 1 is sealed by a sealing member 7 made of resin, and a portion of the lead frame 67 sticking outside from the sealing member 7 is formed to form a lead 5.

As described above, in accordance with the present embodiment, the cap 13 made of a semiconductor is secured to the base 11 so as to seal the sensor unit 17 so that, even when the sensor main body 1, which has an combined structure between the cap 13 and base 11, is sealed by using an inexpensive resin sealing process in the same manner as a general IC chip, it becomes possible to protect the sensor unit 17 from the resin, and consequently to make the acceleration sensor inexpensive and accomplish a small-size, light-weight structure.

Moreover, since the securing process of the cap 13 to the base 11 is carried out through an eutectic bonding, a securing process can be carried out without using a bonding material, such as low-melting-point glass. For this reason, it is possible to eliminate the necessity of a coating process of the bonding material to the base, and also to eliminate the necessity of taking deviations of the coating position of the bonding material into consideration; consequently, it becomes possible to make the sensor size smaller.

Furthermore, since the cap main body 13a of the cap 13 has a conductive property, the cap 13 can be electrically connected to the base 11 so that it becomes possible to prevent structures inside the sensor unit 17 of the base 11, such as a mass body, from sticking to the cap 13 due to influences of static electricity accumulated in the cap 13.

Since the acceleration sensor is formed by a semiconductor processing technique, it is possible to easily assemble a circuit used for signal processing, etc. in the base 11.

Moreover, the wiring pattern 35, formed in the substrate 15 of the base 15, is embedded in the grooves 33a formed on the surface of the oxide film 33 of the substrate 15 so that the film thickness of the wiring pattern 35 is made coincident with the depth of the grooves 33a; thus, it is possible to eliminate the irregularity of the surface of the substrate 15 due to the presence of the wiring pattern 33, and consequently to flatten the surface of the substrate 15. As a result, without the necessity of carrying out complicated processes in the formation process of the frame portion 19, such as a partially adjusting process of the film thickness of the frame portion 19, it is possible to easily flatten the contact surface of the cap 13 to the frame portion 19.

Furthermore, since it is possible to electrically connect the cap 13 to the base through the frame portion 19, it is not necessary to provide a special means used for connecting the cap.

Since the cap 13 is connected to the base 11 in an eutectic manner, it is possible to electrically connect the cap 13 to the base 11.

Moreover, the joining layer 19c of the frame portion 19, which is joined to the cap 13 in an eutectic manner, has its one portion set to a conductive conductor portion 19f with the other area being set to a joining portion 19e formed by the semiconductor for joining; therefore, the joining layer 19c may be used for eutectic bonding and electrical connection between the cap 13 and the frame portion 19.

The formation of the mass body 21 and the beam 25 on the substrate 15 makes it possible to electrically connect the wire 41 formed on the substrate to the mass body 21 through the supporting portion 25a so that it is possible to easily set the mass body 21 and the wire 41 to the same electrical potential, and also to prevent the mass body 21 from sticking to the substrate 15 due to static electricity from the point of time at which the mass body 21 was formed.

Moreover, since the wire 41 is provided with an exposed portion 41a that is placed on the substrate 15 in an exposed state at an opposing area facing the mass body 21 on the substrate 15, it is possible to set the mass body 21 and the wire 41 to the same electrical potential, and consequently to prevent the mass body 21 and the substrate 15 from sticking to each other by static electricity.

Furthermore, since the wire 41 is electrically connected also to the cap 13 through the frame portion 19 so that the mass body 21 and the cap 13 are set to the same electrical potential through the beam 25, the wire 41 and the frame portion 19, thereby making it possible to prevent the mass body 21 from sticking to the cap 13 through static electricity.

Moreover, the wiring pattern 35 is formed with a margin corresponding to a gap dimension F inside the groove 33a from the side edge 33b of each groove 33a; therefore, it is possible to form a wiring pattern 35 with a flat surface and a uniform film thickness, and consequently to flatten the surface of the substrate 15 more efficiently even when the nitride film 37 having a uniform film thickness is formed.

The wafer 51 on which a plurality of bases 11 are formed and the wafer 53 on which a plurality of caps 13 are formed are positioned and superposed so that, after simultaneously joining the respective caps 13 and the respective bases 11 in an eutectic manner, the wafers 51, 53 are subjected to dicing process; therefore, it is not necessary to individually handle the bases 11 and the caps 13 that are small parts so that it becomes possible to manufacture a plurality of acceleration sensors efficiently.

While the present invention has been described in detail, the above description is illustrative in all aspects and the present invention is not restricted thereto. It will be understood that numerous variants which are not illustrated can be supposed without departing from the scope of the invention.

What is claimed is:

1. An acceleration sensor comprising:
   a base; and
   a cap attached to said base, wherein
   said cap includes:
      a cap main body formed by a conductive semiconductor material, said cap main body including a circumferential edge; and
      a metal film formed on said circumferential edge by using a metal material, and
   said base includes:
      substrate;
      a sensor unit formed on the surface of said substrate, and having a function of detecting acceleration; and
      a frame portion formed on said surface of said substrate in a manner so as to externally surround said sensor unit, having a contact face making contact with said circumferential edge of said cap at least one portion of which is formed by a semiconductor for joining, wherein said at least one portion of said contact face is joined to said circumferential edge of said cap in an eutectic manner so that it cooperatively functions with said cap to seal said sensor unit from its external environment,
   wherein
   said frame portion includes:
      a conductive frame main body formed on said surface of said substrate; and
      a joining layer formed on said frame main body, and joined to said metal layer of said cap in an eutectic manner, and
   said joining layer includes:
      a conductor portion formed by a conductive material and located in an area of one portion of the upper face of said frame main body; and
      a joining portion formed by said semiconductor for joining and located in an area other than said area on the upper face of the frame main body having said conductor portion;
   wherein
   a wiring pattern formed on a said substrate and said frame main body of said frame portion are electrically connected to each other.

2. An acceleration sensor comprising,
   a base; and
   a cap attached to said base, wherein
   said cap includes:
      a cap main body formed by a conductive semiconductor material, said cap main body including a circumferential edge; and
      a metal film formed on said circumferential edge by using a metal material, and
   said base includes:
      a substrate;
      a sensor unit formed on the surface of said substrate, and having a function of detecting acceleration; and
      a frame portion formed on said surface of said substrate in a manner so as to externally surround said sensor unit, having a contact face making contact with said circumferential edge of said cap at least one portion of which is formed by a semiconductor for joining, wherein said at least one portion of said contact face is joined to said circumferential edge of said cap in an eutectic manner so that is cooperatively functions with said cap to seal said sensor unit from its external environment,
   wherein
   said substrate includes;
      a substrate main body;
      an insulating film formed on said substrate main body;
      a wiring pattern selectively formed on said insulating film and drawn from an inside to an outside of an area surrounded by said frame portion,
      grooves, which correspond to said wiring pattern, are formed in said insulating film, and
      said wiring pattern is embedded into said grooves of said insulating film under said frame portion, a film thickness thereof is made coincedent with a depth of said grooves.

3. The acceleration sensor according to claim 2, wherein
   said sensor unit includes:
      a conductive mass body for detecting acceleration, which is supported with a predetermined gap from said substrate; and
      a supporting portion integrally formed with said mass body on said substrate by using a material having a conductive property, and supporting said mass body, and
      said wiring pattern is placed under said supporting portion so as to be electrically connected to said supporting portion and arranged so as to be exposed on said substrate at an opposing area that faces said mass body on said substrate.

4. The acceleration sensor according to claim 2, wherein
   said wiring pattern is formed by a semiconductor in which impurities are doped.

5. The acceleration sensor according to claim 2, wherein
   said wiring pattern is formed by metal having a high-melting point.

6. A manufacturing method of an acceleration sensor according to claim 1, comprising:
   forming a plurality of bases on a first wafer in a matrix format;
   forming a plurality of caps on a second wafer in a matrix format at positions corresponding to the formation positions of said respective bases formed on said first wafer;
   joining said respective bases to said respective caps in an eutectic manner by superposing said first wafer on said second wafer and applying a heating process thereto with said frame portion of each of said bases and said circumferential edge of each of said caps being positioned so as to make contact with each other;
   dicing said first wafer and said second wafer so that the sensor main bodies, each being formed by joining said respective bases and said respective caps, are separated from one another.

7. The manufacturing method of an acceleration sensor according to claim 6, further comprising:
   die-bonding said sensor main body to a lead frame;
   electrically connecting the pad portion of said sensor main body and said lead frame to each other through wire bonding;
   sealing said sensor main body by a sealing member made of resin; and
   forming a lead by forming said lead frame.

8. The manufacturing method of an acceleration sensor according to claim 2, comprising:
    forming said insulating film on said substrate main body;
    forming said grooves by partially etching said surface of said insulating film;
    depositing a conductive film on said insulating film by using a same material as said wiring pattern with a film thickness which is a same as the depth of said grooves;
    patterning said conductive film so as to remove portions other than a portion located inside each of said grooves by a predetermined gap dimension from the side edge of each of said grooves in said conductive film so that residual portions form said wiring pattern; and
    forming said sensor unit and said frame portion on said substrate.

* * * * *